(12) United States Patent
Lin et al.

(10) Patent No.: US 8,975,511 B2
(45) Date of Patent: Mar. 10, 2015

(54) PHOTOVOLTAIC DEVICE

(75) Inventors: Liang-Bih Lin, Carlsbad, CA (US); George Cunha Cardoso, Webster, NY (US); Amanda Elizabeth Preske, Rochester, NY (US); Krishna Balantrapu, Marlborough, MA (US)

(73) Assignee: Xerox Corporation, Norwalk, CT (US)

( * ) Notice: Subject to any disclaimer, the term of this patent is extended or adjusted under 35 U.S.C. 154(b) by 1060 days.

(21) Appl. No.: 13/027,306

(22) Filed: Feb. 15, 2011

(65) Prior Publication Data

US 2012/0204958 A1 Aug. 16, 2012

(51) Int. Cl.
- *H01L 31/0256* (2006.01)
- *H01L 31/18* (2006.01)
- *H01B 1/00* (2006.01)
- *H01L 51/00* (2006.01)
- *B82Y 10/00* (2011.01)
- *H01L 51/42* (2006.01)

(52) U.S. Cl.
CPC ............ *H01L 51/004* (2013.01); *B82Y 10/00* (2013.01); *H01L 51/0047* (2013.01); *H01L 51/4253* (2013.01); *Y02E 10/549* (2013.01)
USPC .... 136/263; 252/501.1; 438/57; 257/E31.001

(58) Field of Classification Search
CPC ........................ H01G 9/2031; H01G 9/2059
USPC ................. 136/263; 252/501.1; 438/57; 257/E31.001
See application file for complete search history.

(56) References Cited

U.S. PATENT DOCUMENTS 5,028,687 A 7/1991 Yanus et al.
5,030,532 A 7/1991 Limburg et al.

OTHER PUBLICATIONS

Vaddiraju et al., "Radical Salt-Doped Hole Transporters in Organic Photovoltaic Devices," Chem. Mater. 2007, 19, 4049-4055.*
Thompson et al., "Polymer-Fullerene Composite Solar Cells," Angew. Chem. Int. Ed., 2008, 47, 58-77.*

* cited by examiner

*Primary Examiner* — Ling Choi
*Assistant Examiner* — Catherine S Branch
(74) *Attorney, Agent, or Firm* — Fay Sharpe LLP

(57) ABSTRACT

A photovoltaic device includes a substrate, a first electrode, a second electrode, and an active layer between the first electrode and the second electrode. The active layer comprises a polyarylamine biscarbonate ester of Formula (I):

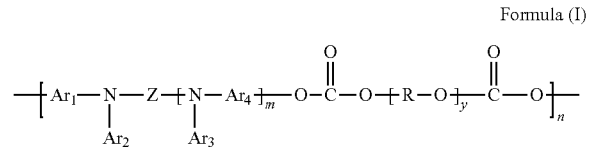

wherein $Ar_1$, $Ar_2$, $Ar_3$, $Ar_4$, R, m, y, and n are as described herein. The photovoltaic device can be fabricated in an ambient environment and does not need significant processing.

13 Claims, 3 Drawing Sheets

PHOTOVOLTAIC DEVICE

BACKGROUND

The present disclosure relates to a photovoltaic device useful for generating an electrical current upon exposure to wide spectrum light, such as sunlight. The materials described herein can be used in organic solar cells.

A photovoltaic device typically contains a layer of a photoactive material (i.e. an active layer) sandwiched between two electrodes (i.e. a cathode and an anode). The photoactive layer can absorb the energy in a photon emitted by radiation, such as sunlight. This photon energy creates an exciton, or bound electron-hole pair. Depending on the material, the electron and hole can travel a short distance (on the order of tens of nanometers) before spontaneous recombination occurs. The exciton can move to a junction where they can be separated, so that electrons are collected at one electrode and holes are collected at the other electrode. This allows current to flow through an external circuit.

Most organic/polymeric semiconductor materials used in solar cell applications have limited storage life, making their implementation difficult. For example, poly(3-hexylthiophene), the best known material in plastic solar cells, has a storage life of only about 1 year. Most organic solar active materials also require post-coating thermal and/or vacuum treatments, as well as additional buffer or blocking layers in their structure, to prevent leakage or facilitate photovoltaic effects. These factors make the fabrication process very cumbersome.

It would be desirable to develop new photovoltaic devices that can achieve a longer storage life and can be fabricated in an ambient environment without any post-casting treatments or any buffer or blocking layers. It would also be desirable to provide a photovoltaic device that can capture more of the light energy present in sunlight and generate greater amounts of electricity, increasing the power conversion efficiency of the device.

BRIEF DESCRIPTION

Disclosed in various embodiments herein are photovoltaic devices. Generally speaking, the photovoltaic devices include a substrate, a first electrode on the substrate, a second electrode, and an active layer between the first electrode and the second electrode.

Disclosed in embodiments is a photovoltaic device comprising an active layer, wherein the active layer comprises an electron acceptor and a polyarylamine biscarbonate ester of Formula (I):

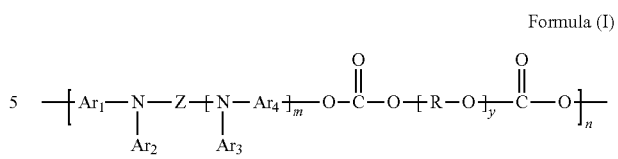

Formula (I)

wherein $Ar_1$ and $Ar_4$ are independently arylene or substituted arylene; $Ar_2$ and $Ar_3$ are independently aryl or substituted aryl; R is alkylene, substituted alkylene, arylene, or substituted arylene; Z is a divalent linkage; m is 0 or 1; y is an integer from 1 to 3; and n represents the number of repeating units.

In particular embodiments, m is 1; $Ar_1$ and $Ar_4$ are phenylene; and $Ar_2$ and $Ar_3$ are phenyl.

In other embodiments, Z is arylene or substituted arylene. In some specific embodiments, Z is biphenylene.

The polyarylamine biscarbone ester may have from about 5 to about 5,000 repeating units.

In particular embodiments, R is $-CH_2-CH_2-$.

The electron acceptor may be $C_{60}$ fullerene, [6,6]-phenyl-$C_{61}$-butyric acid methyl ester (PCBM), $C_{70}$ fullerene, [6,6]-phenyl-$C_{71}$-butyric acid methyl ester, or a fullerene derivative.

The weight ratio of the polyarylamine biscarbonate ester to the electron acceptor may be from 15:85 to 30:70. More specifically, the weight ratio of the polyarylamine biscarbonate ester to the electron acceptor may be about 25:75.

The photovoltaic device may further comprise a substrate, a first electrode upon the substrate, and a second electrode; wherein the active layer is between the first electrode and the second electrode. In specific versions, the device does not comprise any electron blocking layers or hole blocking layers. In other specific versions, the active layer directly contacts the first electrode and the second electrode.

The polyarylamine biscarbonate ester may have the structure of Formula (A):

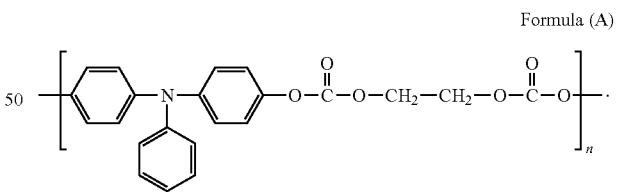

Formula (A)

The polyarylamine biscarbonate ester may also have the structure of Formula (B):

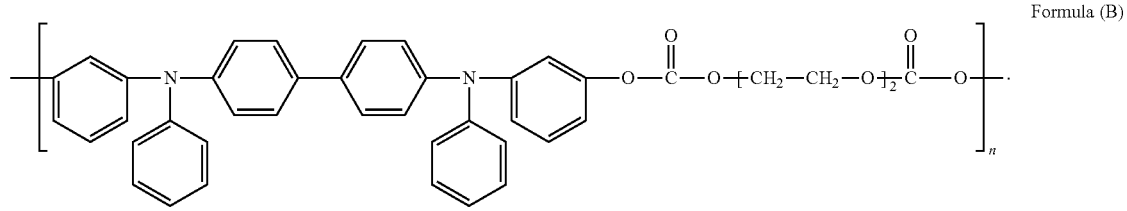

Formula (B)

Also disclosed in embodiments is a photovoltaic device comprising: a substrate; a first electrode upon the substrate; a second electrode; and an active layer between the first electrode and the second electrode; wherein the active layer comprises [6,6]-phenyl-$C_{61}$-butyric acid methyl ester (PCBM) and a polyarylamine biscarbonate ester of Formula (I):

Formula (I)

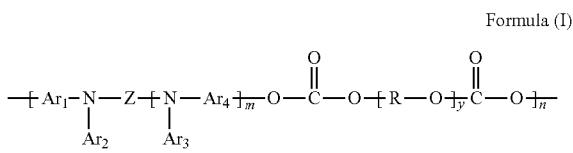

wherein $Ar_1$ and $Ar_4$ are independently arylene or substituted arylene; $Ar_2$ and $Ar_3$ are independently aryl or substituted aryl; R is alkylene, substituted alkylene, arylene, or substituted arylene; Z is a divalent linkage; m is 0 or 1; y is an integer from 1 to 3; and n represents the number of repeating units.

The active layer may comprise from about 15 to about 30 wt % of the polyarylamine biscarbonate ester.

In specific embodiments, m is 1; $Ar_1$ and $Ar_4$ are phenylene; $Ar_2$ and $Ar_3$ are phenyl; y is 1 or 2; and R is —$CH_2$—$CH_2$—.

Also disclosed is a method for producing a photovoltaic device, the method comprising: liquid depositing an active layer solution on an electrode; and drying the active layer solution to form an active layer on the electrode; wherein the active layer solution comprises an electron acceptor and a polyarylamine biscarbonate ester of Formula (I):

Formula (I)

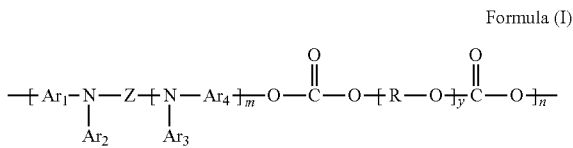

wherein $Ar_1$ and $Ar_4$ are independently arylene or substituted arylene; $Ar_2$ and $Ar_3$ are independently aryl or substituted aryl; R is alkylene, substituted alkylene, arylene, or substituted arylene; Z is a divalent linkage; m is 0 or 1; y is an integer from 1 to 3; and n represents the number of repeating units.

The active layer is not thermal annealed or vacuum annealed after drying.

These and other non-limiting characteristics of the disclosure are more particularly disclosed below.

BRIEF DESCRIPTION OF THE DRAWINGS

The following is a brief description of the drawings, which are presented for the purposes of illustrating the exemplary embodiments disclosed herein and not for the purposes of limiting the same.

DETAILED DESCRIPTION

Figure 1:
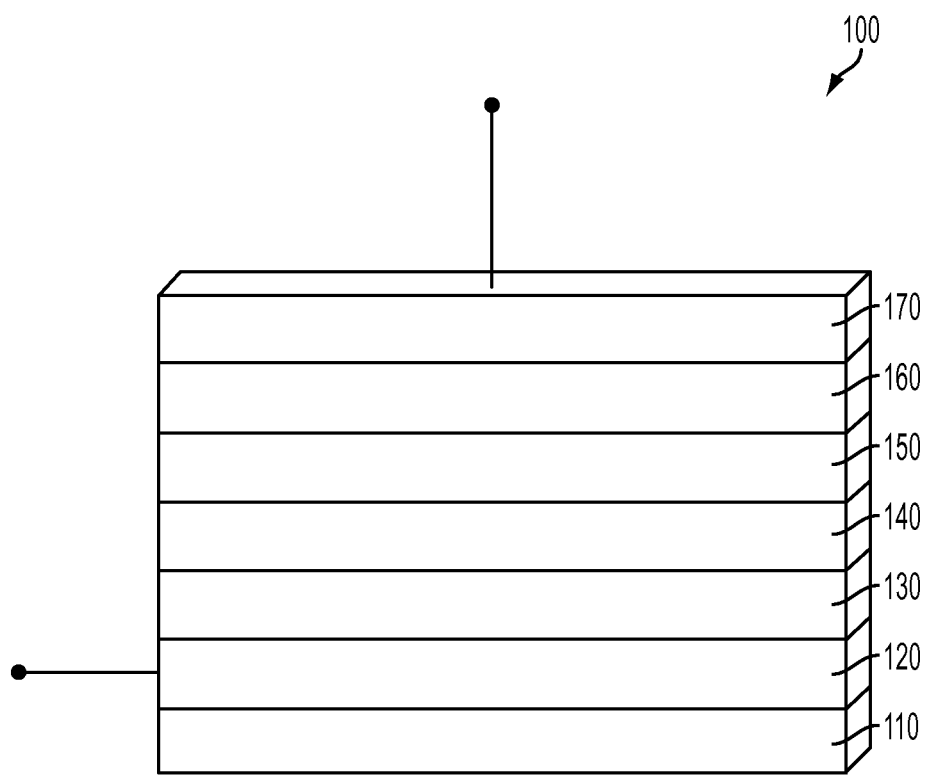
FIG. 1 is a cross-sectional view of a first exemplary photovoltaic device of the present disclosure.

A more complete understanding of the components, processes and apparatuses disclosed herein can be obtained by reference to the accompanying drawings. These figures are merely schematic representations based on convenience and the ease of demonstrating the present disclosure, and are, therefore, not intended to indicate relative size and dimensions of the devices or components thereof and/or to define or limit the scope of the exemplary embodiments.

Although specific terms are used in the following description for the sake of clarity, these terms are intended to refer only to the particular structure of the embodiments selected for illustration in the drawings, and are not intended to define or limit the scope of the disclosure. In the drawings and the following description below, it is to be understood that like numeric designations refer to components of like function.

The modifier "about" used in connection with a quantity is inclusive of the stated value and has the meaning dictated by the context (for example, it includes at least the degree of error associated with the measurement of the particular quantity). When used in the context of a range, the modifier "about" should also be considered as disclosing the range defined by the absolute values of the two endpoints. For example, the range of "from about 2 to about 10" also discloses the range "from 2 to 10."

The term "comprising" is used herein as requiring the presence of the named component and allowing the presence of other components. The term "comprising" should be construed to include the term "consisting of", which allows the presence of only the named component, along with any impurities that might result from the manufacture of the named component.

The term "upon" as used herein should be construed as describing the location of a first component relative to the second component. The term should not be construed as requiring that the first component directly contact the second component, although this direct contact is covered by the use of the term.

The present disclosure relates to photovoltaic devices including an active layer. The active layer comprises a polyarylamine biscarbonate ester (or PABC) and an electron acceptor.

FIG. 1 is a side cross-sectional view of an exemplary photovoltaic device 100. A substrate 110 is provided. A first electrode, such as anode 120, is located upon the substrate 110. A semiconducting layer, such as active layer 140, is then located upon the anode 120. An optional electron blocking layer 130 may be located between the anode 120 and the first semiconducting layer 140, if desired. A second electrode, such as cathode 170, is placed upon the substrate 110 and upon the active layer 140. An optional electron transporting layer 150 may be placed upon the active layer 140. An optional hole blocking layer 160 can be located upon the optional electron transporting layer 150. It should be noted that the anode 120 is closer to the substrate 110 than the cathode 170.

Figure 2:
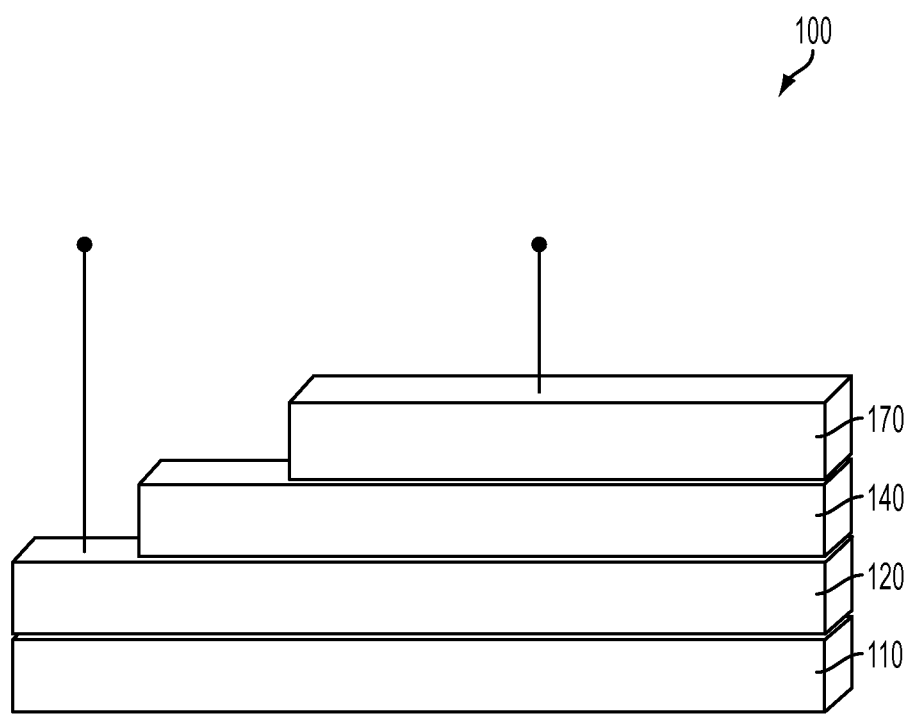
FIG. 2 is a cross-sectional view of a second exemplary photovoltaic device of the present disclosure.

As illustrated in FIG. 2, only the substrate 110, anode 120, semiconducting layer 140, and cathode 170 are required to produce a functioning photovoltaic device. However, the additional layers may be helpful in obtaining a highly efficient photovoltaic device. In particular embodiments, though, the photovoltaic device does not comprise a hole blocking layer or an electron blocking layer.

The active layer comprises a polyarylamine biscarbonate ester of Formula (I)

Formula (I)

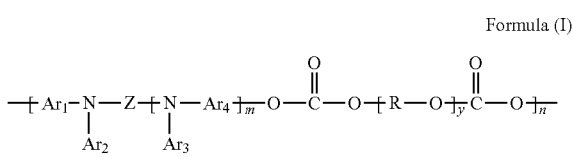

wherein $Ar_1$ and $Ar_4$ are independently arylene or substituted arylene; $Ar_2$ and $Ar_3$ are independently aryl or substituted aryl; R is alkylene, substituted alkylene, arylene, or substituted arylene; Z is a divalent linkage; m is 0 or 1; y is an integer from 1 to 3; and n represents the number of repeating units.

The term "alkyl" refers to a radical composed entirely of carbon atoms and hydrogen atoms which is fully saturated, having the formula —$C_nH_{2n+1}$. The alkyl radical may be linear, branched, or cyclic.

The term "alkylene" refers to a fully saturated radical composed entirely of carbon atoms and hydrogen atoms, and having the ability to form a single bond with two different non-hydrogen atoms. An alkylene radical has the formula —$C_nH_{2n}$—.

The term "aryl" refers to an aromatic radical composed entirely of carbon atoms and hydrogen atoms. When aryl is described in connection with a numerical range of carbon atoms, it should not be construed as including substituted aromatic radicals. For example, the phrase "aryl containing from 6 to 10 carbon atoms" should be construed as referring to a phenyl group (6 carbon atoms) or a naphthyl group (10 carbon atoms) only, and should not be construed as including a methylphenyl group (7 carbon atoms). Exemplary aryl groups include phenyl, biphenyl, and fluorenyl.

The term "arylene" refers to an aromatic radical having the ability to form a single bond with two different non-hydrogen atoms. Again, when described in connection with a numerical range of carbon atoms, this term should not be construed as including substituted aromatic radicals. An exemplary arylene is phenylene The term "alkoxy" refers to an alkyl radical which is attached to an oxygen atom, i.e. —O—$C_nH_{2n+1}$.

The term "substituted" refers to at least one hydrogen atom on the named radical being substituted with another functional group, such as halogen, —CN, —$NO_2$, —COOH, —$SO_3H$. An exemplary substituted alkyl group is a perhaloalkyl group, wherein one or more hydrogen atoms in an alkyl group are replaced with halogen atoms, such as fluorine, chlorine, iodine, and bromine. Besides the aforementioned functional groups, an aryl or arylene group may also be substituted with alkyl or alkoxy. Exemplary substituted aryl groups include methylphenyl and methoxyphenyl. Exemplary substituted arylene groups include methylphenylene and methoxyphenylene.

The term "divalent linkage" refers to any moiety which is able to form a single bond with two different atoms that are not hydrogen, joining those two different atoms together. Exemplary divalent linkages include —O—, —NH—, alkylene, and arylene.

Generally, the alkyl, alkylene, and alkoxy groups each independently contain from 1 to 30 carbon atoms, but in particular embodiments may have from 2 to 10 carbon atoms. Similarly, the aryl and arylene groups independently contain from 6 to 30 carbon atoms. In embodiments, n is from about 5 to about 5,000.

In some embodiments, $Ar_1$, $Ar_2$, $Ar_3$, and $Ar_4$ are the same. In particular embodiments where m is 1, $Ar_1$ and $Ar_4$ are phenylene, and $Ar_2$ and $Ar_3$ are phenyl.

In specific embodiments, Z is arylene or substituted arylene. In particular embodiments, Z is biphenylene (—$C_6H_4$—$C_6H_4$—).

In specific embodiments, R is alkylene. In particular embodiments, R is ethylene or —$CH_2$—$CH_2$—.

In particular embodiments, the polyarylamine biscarbonate ester may have the structure of Formula (A) or Formula (B):

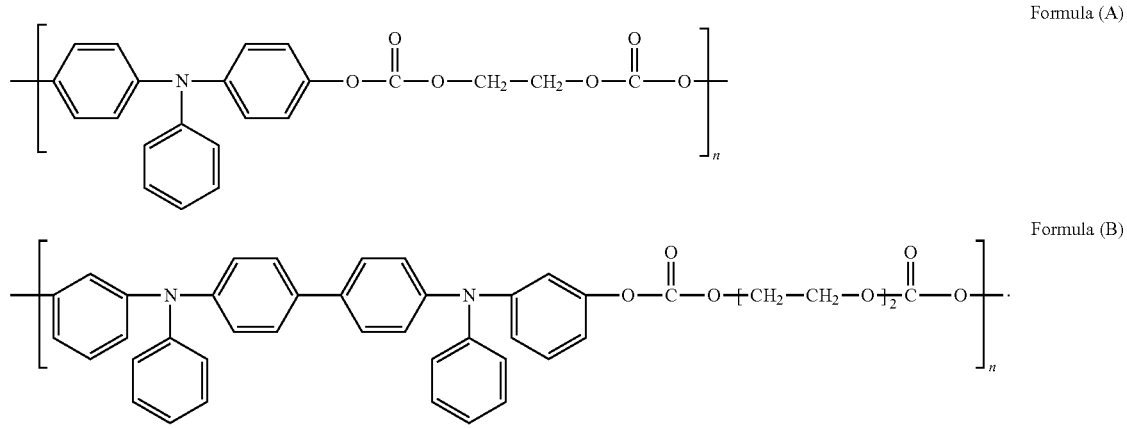

The polyarylamine biscarbonate esters of Formula (I) can be considered to be polycarbonate copolymers, which are formed generally from the reaction of (i) a nitrogenous compound having two hydroxyl groups with (ii) a bischloroformate. Triethylamine may be used to catalyze the reaction. For example, the PABC of Formula (A) can be formed from the monomers of bis(4-hydroxyphenyl)phenylamine and ethylene glycol bischloroformate, which are shown below:

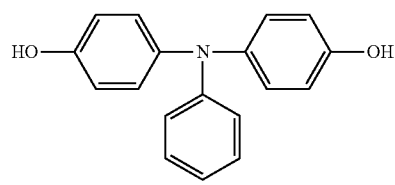

bis(4-hydroxyphenyl)phenylamine

-continued

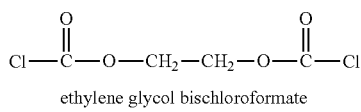
ethylene glycol bischloroformate

Similarly, the PABC of Formula (B) can be formed from the monomers of N,N'-diphenyl-N,V-bis(3-hydroxyphenyl)-[1,1'-biphenyl]-4,4'-diamine and diethylene glycol bischloroformate, which are shown below:

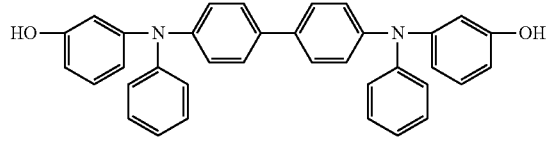

N,N'-diphenyl-N,N'-bis(3-hydroxyphenyl)-[1,1'-biphenyl]-4,4'-diamine (DHTBD)

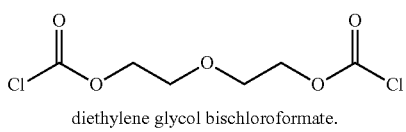

diethylene glycol bischloroformate.

The active layer further comprises an electron acceptor. An electron acceptor is a material or compound that accepts electrons transferred to it by another compound. Generally speaking, the electron acceptor moves electrons more efficiently than the polyarylamine biscarbonate ester. In some embodiments, the electron acceptor is a fullerene or fullerene derivative. In specific embodiments, the electron acceptor is $C_{60}$ fullerene, [6,6]-phenyl-$C_{61}$-butyric acid methyl ester (PCBM), $C_{70}$ fullerene, or [6,6]-phenyl-$C_{71}$-butyric acid methyl ester.

In particular embodiments, the electron acceptor is PCBM. PCBM has the following formula:

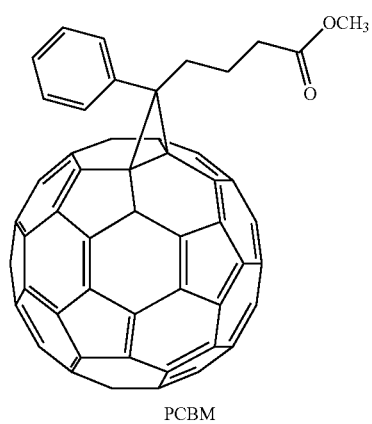 [SMILES: COC(=O)CCCC1(c2ccccc2)C23c4c5cc6cc7cc8c9c7c7c%10c(c4c67)C4c6c7c(c(cc%11c7c7c(cc(c%12c7c6c%10c%129)C8)C%11)CC2C=5)C413]

PCBM $C_{70}$ fullerene and PC[70]BM have the following formulas:

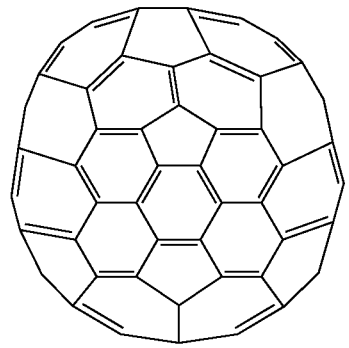

$C_{70}$ fullerene

PC[70]BM

One major advantage of the polyarylamine biscarbonate esters of Formula (I) is that they have a stable shelf life of over a decade as well as a long operating life. In contrast, the typical storage life of polythiophenes is less than 18 months. In addition, most photovoltaic materials are oxygen sensitive and fabrication must occur in an inert atmosphere. In contrast, the present semiconducting layer can be fabricated in an ambient environment. Also, no electron blocking or hole blocking layers are necessary to obtain good performance.

The semiconducting layer can be formed using liquid deposition processes, such as spin coating, dip coating, blade coating, rod coating, screen printing, stamping, and ink jet printing, as well as other conventional processes known in the art. A semiconducting composition is typically formed which comprises the PABC of Formula (I), the electron acceptor, and a solvent. Exemplary solvents may include water; alcohols such as methanol, ethanol, propanol, butanol, pentanol, hexanol, ethylene glycol, dowanol, and methoxyethanol; acetates such as ethyl acetate and propylene glycol monoethyl ether acetate; ketones such as methyl isobutyl ketone, methyl isoamyl ketone, acetone, methyl ethyl ketone, and methyl propyl ketone; ethers such as petroleum ether, tetrahydrofuran, and methyl t-butyl ether; hydrocarbons such as hexane, cyclohexane, cyclopentane, hexadecane, and iso-octane; aromatic hydrocarbons such as toluene, xylene, ethyl benzene, and mesitylene; chlorinated solvents such as chloroform, dichloromethane, dichloroethane, chlorobenzene, dichlorobenzene, and trichlorobenzene; and other solvents such as dimethyl sulfoxide, trifluoroacetic acid, acetonitrile, dimethyl formamide, dimethyl acetamide, pyridine, and n-methyl-alpha-pyrrolidinone.

Compositions comprising PABC and PCBM exhibit good film forming properties at various weight ratios. Also, certain ratios of PABC to PCBM show good power conversion efficiencies in the resulting photovoltaic device. In embodiments, the weight ratio of the polyarylamine biscarbonate ester to the electron acceptor is from 15:85 to 30:70 (in either the semiconducting composition or the semiconducting layer itself). In particular embodiments, the weight ratio of the polyarylamine biscarbonate ester to the electron acceptor is about 25:75. Put another way, the active layer may comprise from about 15 to about 30 wt % of the polyarylamine biscarbonate ester.

The active layer may have a thickness of from about 50 nanometers to about 150 nanometers.

The photovoltaic device may be produced by liquid depositing an active layer solution on an electrode. The active layer solution comprises an electron acceptor and a polyarylamine biscarbonate ester of Formula (I):

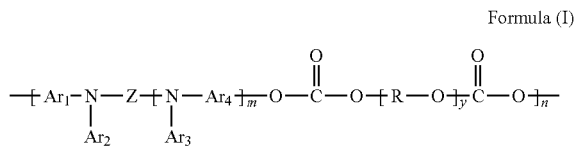

Formula (I)

wherein $Ar_1$ and $Ar_4$ are independently arylene or substituted arylene; $Ar_2$ and $Ar_3$ are independently aryl or substituted aryl; R is alkylene, substituted alkylene, arylene, or substituted arylene; Z is a divalent linkage; m is 0 or 1; y is an integer from 1 to 3; and n represents the number of repeating units.

The active layer solution is then dried to form the active layer. In particular, the photovoltaic device may be fabricated without a thermal or vacuum annealing step.

The substrate 110 of the photovoltaic device supports the other components of the photovoltaic device. The substrate should also be optically transparent at least from the violet to the red portion of the spectrum, to allow light to pass through and contact the semiconducting layer. In embodiments, the substrate is composed of materials including, but not limited to, glass, silicon, or a plastic film or sheet. For structurally flexible devices, plastic substrate, such as for example polyester, polycarbonate, polyimide sheets and the like may be used. The thickness of the substrate may be from about 10 micrometers to over 10 millimeters with an exemplary thickness being from about 50 micrometers to about 5 millimeters, especially for a flexible plastic substrate and from about 0.5 to about 10 millimeters for a rigid substrate such as glass or silicon.

The anode 120 and the cathode 170 are composed of an electrically conductive material. Exemplary materials suitable for the electrodes include aluminum, gold, silver, chromium, nickel, platinum, indium tin oxide (ITO), zinc oxide (ZnO), and the like. One of the electrodes, and in particular the anode, is made of an optically transparent material like ITO or ZnO. In specific embodiments, the anode is ITO and the cathode is aluminum. Typical thicknesses for the electrodes are about, for example, from about 40 nanometers to about 1 micrometer, with a more specific thickness being about 40 to about 400 nanometers.

An electron blocking layer 130 may be present between the anode 120 and the semiconducting layer 140. This layer prevents recombination at the anode by inhibiting the movement of electrons to the anode. Exemplary materials include poly (3,4-ethylenedioxythiophene):poly(styrene sulfonic acid) (PEDOT:PSS), $MoO_3$, and $V_2O_5$. The electron blocking layer may have a thickness of from about 1 to about 100 nanometers.

An electron transporting layer 150 may be present between the semiconducting layer 140 and the cathode 170. This layer is generally made from a material which allows electrons to move efficiently, and may also absorb some light wavelengths. Exemplary materials for the electron transporting layer include $C_{60}$ fullerene, [6,6]-phenyl-$C_{61}$-butyric acid methyl ester (PCBM), $C_{70}$ fullerene, [6,6]-phenyl-$C_{71}$-butyric acid methyl ester (PC[70]BM), or any fullerene derivative. The electron transporting layer may have a thickness of from about 1 nanometers to about 50 nanometers.

A hole blocking layer 160 may also be located between the semiconducting layer 140 and the cathode 170. When the electron transporting layer is present, the hole blocking layer 160 is between the electron transporting layer 150 and the cathode 170. Exemplary hole blocking materials for this layer include bathocuproine (BCP), lithium fluoride, and bathophenanthroline. The hole blocking layer may have a thickness of from about 0.1 nanometers to about 100 nanometers.

Again, in particular embodiments, no hole blocking layers or electron blocking layers are used in the photovoltaic device of the present disclosure. In specific embodiments, the active layer directly contacts the first electrode and the second electrode.

The following examples are for purposes of further illustrating the present disclosure. The examples are merely illustrative and are not intended to limit devices made in accordance with the disclosure to the materials, conditions, or process parameters set forth therein. All parts are percentages by weight unless otherwise indicated.

EXAMPLE

Photovoltaic devices including active layers comprising PABC and PCBM at various weight ratios were fabricated. A solution comprising 2 wt % PABC/PCBM in monochlorobenzene solvent was spin cast onto an ITO coated glass substrate in an ambient laboratory environment to form an active layer. The active layer had a thickness of from about 50 to about 150 nm. Then, a 100-200 nm aluminum electrode layer was vacuum sublimed onto the active layer. In these devices, the ITO functioned as the anode and the aluminum layer functioned as the cathode.

Figure 3:
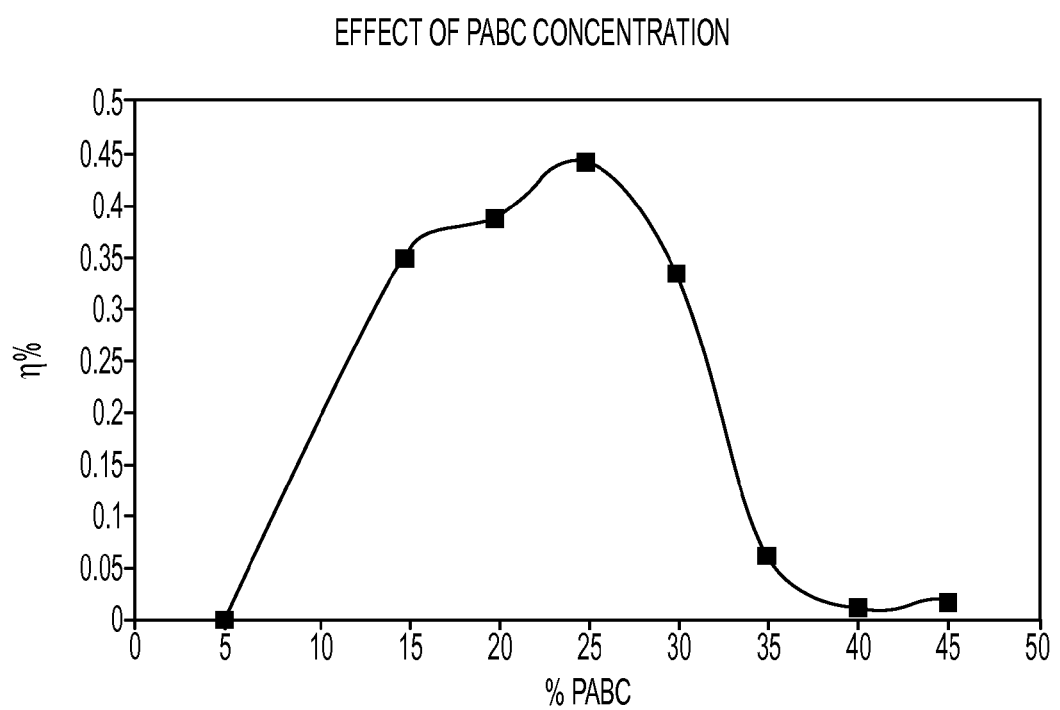
FIG. 3 is a graph showing the efficiency of a photovoltaic device as a function of the amount of a polyarylamine biscarbonate ester in the active layer.

The results are shown in FIG. 3, which shows the power conversion efficiency as a function of the amount of PABC (wt %). The highest efficiency achieved was 0.45% for a device having an active layer with 25 wt % PABC and 75 wt % PCBM. When the amount of PABC was increased to 30 wt %, the efficiency decreased to about 0.32%. Further increases in the amount of PABC resulted in devices exhibiting an even lower efficiency: 0.05% efficiency at 35 wt % PABC and almost zero efficiency at 40 and 45 wt % PABC. When the PABC concentration was decreased to 20 wt % and 15 wt %, the devices exhibited efficiencies of about 0.40% and 0.35%, respectively. At 5 wt % PABC, the efficiency was negligible.

It will be appreciated that variants of the above-disclosed and other features and functions, or alternatives thereof, may be combined into many other different systems or applications. Various presently unforeseen or unanticipated alternatives, modifications, variations or improvements therein may be subsequently made by those skilled in the art which are also intended to be encompassed by the following claims.

What is claimed is:

1. A photovoltaic device comprising an active layer, wherein the active layer comprises an electron acceptor and a polyarylamine biscarbonate ester of Formula (A):

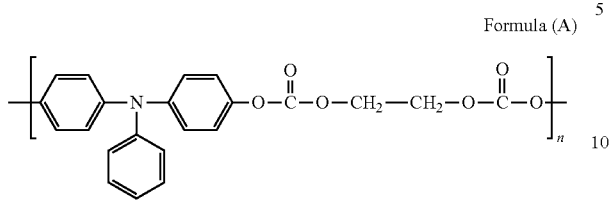

Formula (A)

wherein n represents the number of repeating units.

2. The photovoltaic device of claim 1, wherein n is from about 5 to about 5,000.

3. The photovoltaic device of claim 1, wherein the electron acceptor is $C_{60}$ fullerene, [6,6]-phenyl-$C_{61}$-butyric acid methyl ester (PCBM), $C_{70}$ fullerene, [6,6]-phenyl-$C_{71}$-butyric acid methyl ester, or a fullerene derivative.

4. The photovoltaic device of claim 1, wherein the electron acceptor is PCBM.

5. The photovoltaic device of claim 1, wherein the weight ratio of the polyarylamine biscarbonate ester to the electron acceptor is from 15:85 to 30:70.

6. The photovoltaic device of claim 1, wherein the weight ratio of the polyarylamine biscarbonate ester to the electron acceptor is about 25:75.

7. The photovoltaic device of claim 1, further comprising a substrate, a first electrode upon the substrate, and a second electrode; wherein the active layer is between the first electrode and the second electrode.

8. The photovoltaic device of claim 1, wherein the device does not comprise any electron blocking layers or hole blocking layers.

9. The photovoltaic device of claim 1, wherein the active layer directly contacts the first electrode and the second electrode.

10. A photovoltaic device comprising:
a substrate;
a first electrode on the substrate;
a second electrode; and
an active layer between the first electrode and the second electrode;
wherein the active layer comprises [6,6]-phenyl-$C_{61}$-butyric acid methyl ester (PCBM) and a polyarylamine biscarbonate ester of Formula (A):

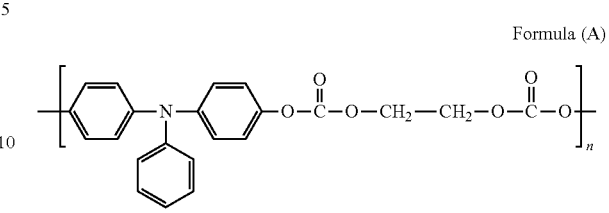

Formula (A)

wherein n represents the number of repeating units.

11. The photovoltaic device of claim 10, wherein the active layer comprises from about 15 to about 30 wt% of the polyarylamine biscarbonate ester.

12. A method for producing a photovoltaic device, the method comprising:
liquid depositing an active layer solution on an electrode; and
drying the active layer solution to form an active layer on the electrode;
wherein the active layer solution comprises an electron acceptor and a polyarylamine biscarbonate ester of Formula (A):

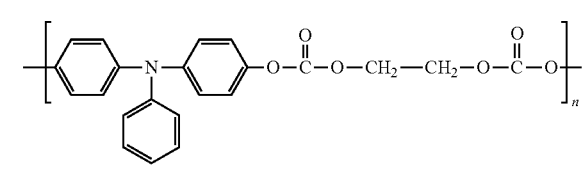

wherein n represents the number of repeating units.

13. The method of claim 12, wherein the active layer is not thermal annealed or vacuum annealed after drying.

* * * * *